United States Patent
Nakatsuji et al.

(10) Patent No.: US 12,347,506 B2
(45) Date of Patent: Jul. 1, 2025

(54) PHOTONIC SPIN REGISTER, INFORMATION WRITING METHOD, AND INFORMATION READ-OUT METHOD

(71) Applicant: The University of Tokyo, Tokyo (JP)

(72) Inventors: Satoru Nakatsuji, Tokyo (JP); Junji Yumoto, Tokyo (JP); Ryo Shimano, Tokyo (JP); Masamitsu Hayashi, Tokyo (JP); Mitsuru Takenaka, Tokyo (JP); Yusuke Horinouchi, Tokyo (JP)

(73) Assignee: The University of Tokyo, Tokyo (JP)

( * ) Notice: Subject to any disclaimer, the term of this patent is extended or adjusted under 35 U.S.C. 154(b) by 174 days.

(21) Appl. No.: 18/223,970

(22) Filed: Jul. 19, 2023

(65) Prior Publication Data
US 2023/0368854 A1 Nov. 16, 2023

Related U.S. Application Data

(63) Continuation-in-part of application No. PCT/JP2022/002068, filed on Jan. 20, 2022.
(Continued)

(51) Int. Cl.
*H10B 61/00* (2023.01)
*G11C 11/16* (2006.01)
(Continued)

(52) U.S. Cl.
CPC ........ *G11C 19/0841* (2013.01); *G11C 11/161* (2013.01); *G11C 11/1673* (2013.01);
(Continued)

(58) Field of Classification Search
CPC .............. G11C 11/161; G11C 11/1673; G11C 11/1675; G11C 11/5607; G11C 19/08;
(Continued)

(56) References Cited

U.S. PATENT DOCUMENTS 7,236,386 B2 * 6/2007 Parkin ................ G11C 19/0808
365/158
2007/0074317 A1 3/2007 Pakala et al.
(Continued)

FOREIGN PATENT DOCUMENTS

JP 2009-514193 A 4/2009
JP 2009-164447 A 7/2009
(Continued)

OTHER PUBLICATIONS

International Search Report dated Apr. 5, 2022, issued in counterpart International Application No. PCT/JP2022/002068. (3 pages).
(Continued)

*Primary Examiner* — Thong Q Le
(74) *Attorney, Agent, or Firm* — WHDA, LLP

(57) ABSTRACT

A photonic spin register includes: a shift register unit including a magnetic material layer having a shape extending in one direction; and a write unit configured to write spin information into a magnetic domain in the magnetic material layer by transferring information included in an optical signal that is a pulse amplitude-modulated and serial input signal, to a spin state of the magnetic domain in the magnetic material layer by means of a photocurrent corresponding to the optical signal or by irradiation with the optical signal. When a shift current flows through the shift register unit in the one direction, a domain wall is configured to move in the magnetic material layer, thereby allowing the spin information to move and be buffered in the magnetic material layer.

21 Claims, 14 Drawing Sheets

Related U.S. Application Data

(60) Provisional application No. 63/139,368, filed on Jan. 20, 2021.

(51) Int. Cl.
   | | | |
   |---|---|---|
   | *G11C 13/04* | (2006.01) | |
   | *G11C 19/08* | (2006.01) | |
   | *H01F 10/32* | (2006.01) | |
   | *H10N 50/10* | (2023.01) | |
   | *H10N 50/80* | (2023.01) | |

(52) U.S. Cl.
   CPC ........ *G11C 11/1675* (2013.01); *G11C 13/047* (2013.01); *H10B 61/00* (2023.02); *H01F 10/3254* (2013.01); *H01F 10/3268* (2013.01); *H10N 50/10* (2023.02); *H10N 50/80* (2023.02)

(58) Field of Classification Search
   CPC ....... G11C 11/44; G11C 19/32; G11C 13/047; G11C 13/06; G11C 19/0841; H01F 10/3254; H01F 10/3268; H01F 10/329
   USPC ......... 365/158, 148, 225.5, 171, 243.5, 173, 365/130, 168
   See application file for complete search history.

(56) References Cited

U.S. PATENT DOCUMENTS

| | | |
|---|---|---|
| 2009/0175110 A1 | 7/2009 | Zayets et al. |
| 2014/0016404 A1 | 1/2014 | Kim et al. |
| 2018/0025763 A1 | 1/2018 | Kondo et al. |
| 2018/0301199 A1 | 10/2018 | Sasaki |

FOREIGN PATENT DOCUMENTS

| | | |
|---|---|---|
| JP | 2014-22030 A | 2/2014 |
| JP | 2016-114813 A | 6/2016 |
| JP | 2018-14468 A | 1/2018 |
| JP | 2018-182291 A | 11/2018 |

OTHER PUBLICATIONS

Nozaki et al., "Femtofarad optoelectronic integration demonstrating energy-saving signal conversion and nonlinear functions", Nature Photonics, Jul. 2019, vol. 13, pp. 454-459. (6 pages).

Yang et al., "Ultrafast magnetization reversal by picosecond electrical pulses", Science Advances, Research Article, Nov. 3, 2017, pp. 1-6. (7 pages).

Cai et al., "Ultrafast and energy-efficient spin-orbit torque switching in compensated ferrimagnets", Nature Electronics, Jan. 2020, vol. 3, pp. 37-42. (6 pages).

\* cited by examiner

FIG. 4D
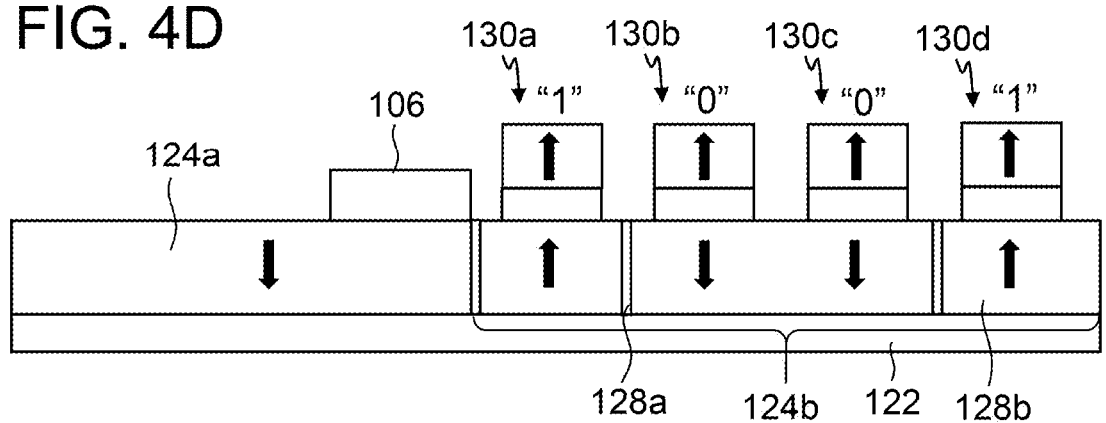
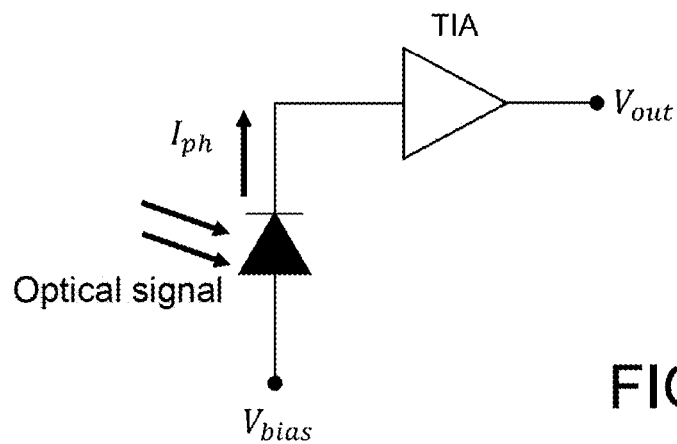
FIG. 5A
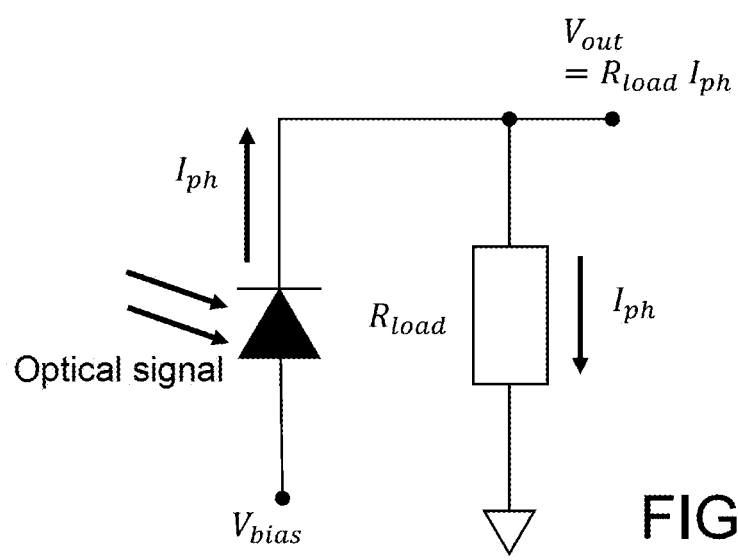
FIG. 5B

PHOTONIC SPIN REGISTER, INFORMATION WRITING METHOD, AND INFORMATION READ-OUT METHOD

CROSS REFERENCE TO RELATED APPLICATIONS

This application is a continuation-in-part application of PCT/JP2022/002068 (filed Jan. 20, 2022), which claim priorities to U.S. provisional Application No. 63/139,368 (filed Jan. 20, 2021). The entire contents of the above applications are incorporated herein by reference.

BACKGROUND OF THE INVENTION

1. Field of the Invention

The present invention relates to a photonic spin register, particularly relates to a photonic spin register, a method of writing information, and a method of reading out information.

2. Description of the Related Art

The recent rapid spread of mobile devices or other such devices produces an explosive increase in data traffic on a network, and requires a further high-speed, large-capacity, and energy-saving information technology (IT). A bottleneck in realizing such a technology lies in a speed gap between an optical signal and an electrical signal. Currently, optical communications enable a high-speed transmission of 400 Gbps per port, whereas a clock frequency in a complementary metal oxide semiconductor (CMOS) circuit is about several GHz, which suggests the speed gap of two orders of magnitude.

A conventional optical device is a voltage-controlled device which uses an amplifier for amplifying a photocurrent and converting the photocurrent into a voltage in order to obtain a necessary output voltage. Unfortunately, use of such an amplifier leads to increased power consumption. In the meantime, there is another technique using a load resistor instead of the amplifier. However, because such a technique requires a large load resistance of about 10 kΩ, the RC time constant increases and the speed of operation does not extend beyond several tens of GHz.

SUMMARY OF THE INVENTION

The higher the transmission speed in the optical communications, the wider the speed gap between the optical signal and the electrical signal. This gap hinders the achievement of high-speed and low power consumed photoelectric interfaces.

In view of the foregoing, the present invention provides a photonic spin register, a method of writing information, and a method of reading out information which allow realization of high-speed and low power consumed photoelectric interfaces.

A photonic spin register according to an aspect of the invention includes: a shift register unit including a magnetic material layer having a shape extending in one direction; and a write unit configured to write spin information into a magnetic domain in the magnetic material layer by transferring information included in an optical signal that is a pulse amplitude-modulated and serial input signal, to a spin state of the magnetic domain in the magnetic material layer by means of a photocurrent corresponding to the optical signal or by irradiation with the optical signal. When a shift current flows through the shift register unit in the one direction, a domain wall is configured to move in the magnetic material layer, thereby allowing the spin information to move and be buffered in the magnetic material layer.

A photonic spin register according to another aspect of the invention includes: a photodetector configured to receive an optical signal that is a pulse amplitude-modulated and serial input signal and convert the optical signal into a photocurrent; a plurality of shift register units each including a magnetic material layer having a shape extending in one direction, the plurality of shift register units being arranged in parallel in a direction perpendicular to the one direction; a write unit configured to be electrically connected to the photodetector and disposed on and intersecting the plurality of shift register units, wherein when the photocurrent flows through the write unit from the photodetector, the write unit is configured to write spin information into a magnetic domain in the magnetic material layer of each of the plurality of shift register units by transferring information included in the optical signal to a spin state of the magnetic domain in the magnetic material layer due to a spin Hall effect; and a control unit configured to be electrically connected to the plurality of shift register units and select one shift register unit through which a shift current is allowed to flow from among the plurality of shift register units. When the shift current flows in the one direction through the one shift register unit selected by the control unit, a domain wall is configured to move in the magnetic material layer of the one shift register unit, thereby allowing the spin information to move and be buffered in the magnetic material layer.

A photonic spin register according to still another aspect of the invention includes: a shift register unit including a magnetic material layer having a shape extending in one direction; a plurality of spin Hall materials arranged in the one direction on the magnetic material layer and configured to exhibit spin Hall effects, wherein when a plurality of pulsed currents based on pieces of input information flow in parallel through the plurality of spin Hall materials, respectively, spin-orbit torques are induced to allow a plurality of pieces of spin information to be written into the magnetic material layer; a read element disposed on the magnetic material layer so as to be adjacent to the plurality of spin Hall materials; and an optical modulator configured to be electrically connected to the read element. When a shift current flows through the shift register unit in the one direction, domain walls are configured to move in the magnetic material layer, thereby allowing the plurality of pieces of spin information to move and be read out in series as an electrical signal via the read element by a magnetoresistance effect. The optical modulator is configured to convert the electrical signal read out via the read element into an optical signal and output the optical signal.

A method of writing information according to still another aspect of the invention includes writing spin information into a magnetic domain in a magnetic material layer having a shape extending in one direction by transferring information included in an optical signal that is a pulse amplitude-modulated and serial input signal, to a spin state of the magnetic domain in the magnetic material layer by means of a photocurrent corresponding to the optical signal or by irradiation with the optical signal.

A method of reading out information according to still another aspect of the invention includes: writing spin information into a magnetic domain in a magnetic material layer having a shape extending in one direction by transferring information included in an optical signal that is a pulse amplitude-modulated and serial input signal, to a spin state of the magnetic domain in the magnetic material layer by means of a photocurrent corresponding to the optical signal or by irradiation with the optical signal; moving the spin information written into the magnetic domain by moving a domain wall in the magnetic material layer by means of a shift current in the one direction; writing and moving the spin information multiple times to sequentially buffer a plurality of pieces of spin information in the magnetic material layer; and reading out the plurality of pieces of spin information in parallel as a plurality of electrical signals via a plurality of read elements, respectively, by a magnetoresistance effect, the plurality of read elements being arranged in the one direction on the magnetic material layer.

A method of reading out information according to still another aspect of the invention includes: causing a plurality of pulsed currents based on pieces of input information to flow in parallel through a plurality of spin Hall materials, respectively, the plurality of spin Hall materials being arranged in one direction on a magnetic material layer having a shape extending in the one direction and configured to exhibit spin Hall effects, the plurality of pulsed currents inducing spin-orbit torques to allow a plurality of pieces of spin information to be written into the magnetic material layer in parallel; moving the plurality of pieces of spin information by moving domain walls in the magnetic material layer by means of a shift current in the one direction; reading out the plurality of pieces of spin information moving in the magnetic material layer, in series as an electrical signal by a magnetoresistance effect via a read element disposed on the magnetic material layer; and using an optical modulator to convert the electrical signal into an optical signal and output the optical signal.

An apparatus according to still another aspect of the invention includes the photonic spin register, and a unit connected to the photonic spin register inputting/outputting an optical signal from/to the photonic spin register. Further, there may be provided an information processing system including at least one information processing apparatus having the photonic spin register, an input interface receiving an optical signal from the outside, a unit providing at least serial-to-parallel conversion by the photonic spin register, and an external interface outputting a signal to the outside.

According to the invention, spin information is written into a magnetic domain in a magnetic material layer by transferring information included in an optical signal to a spin state of the magnetic domain in the magnetic material layer by means of a photocurrent or by irradiation with the optical signal. With this feature, it is possible to realize high-speed and low power consumed photoelectric interfaces utilizing spintronics.

BRIEF DESCRIPTION OF THE DRAWINGS

The novel features believed characteristic of the invention are set forth in the appended claims. The invention itself, however, as well as a preferred mode of use, further advantages thereof, will best be understood by reference to the following detailed description of the illustrative embodiments when read in conjunction with the accompanying drawings, wherein:

FIG. 4D is a schematic view illustrating pieces of spin information buffered in the magnetic material layer;

FIG. 5A is a schematic view demonstrating a concept of a conventional photoelectric interface;

FIG. 5B is a schematic view demonstrating a concept of another conventional photoelectric interface;

DETAILED DESCRIPTION

Exemplary embodiments of the invention will be described below with reference to the drawings. The same reference signs are used to designate the same or similar components throughout the drawings. The drawings are schematic, and a relationship between a plane dimension and a thickness and a thickness ratio of each member are different from the actual ones. It is apparent that each of the drawings includes portions having different dimensional relationships or ratios from each other.

First Embodiment

A first embodiment of the invention will be described with reference to FIGS. 1 to 5C.

Figure 1:
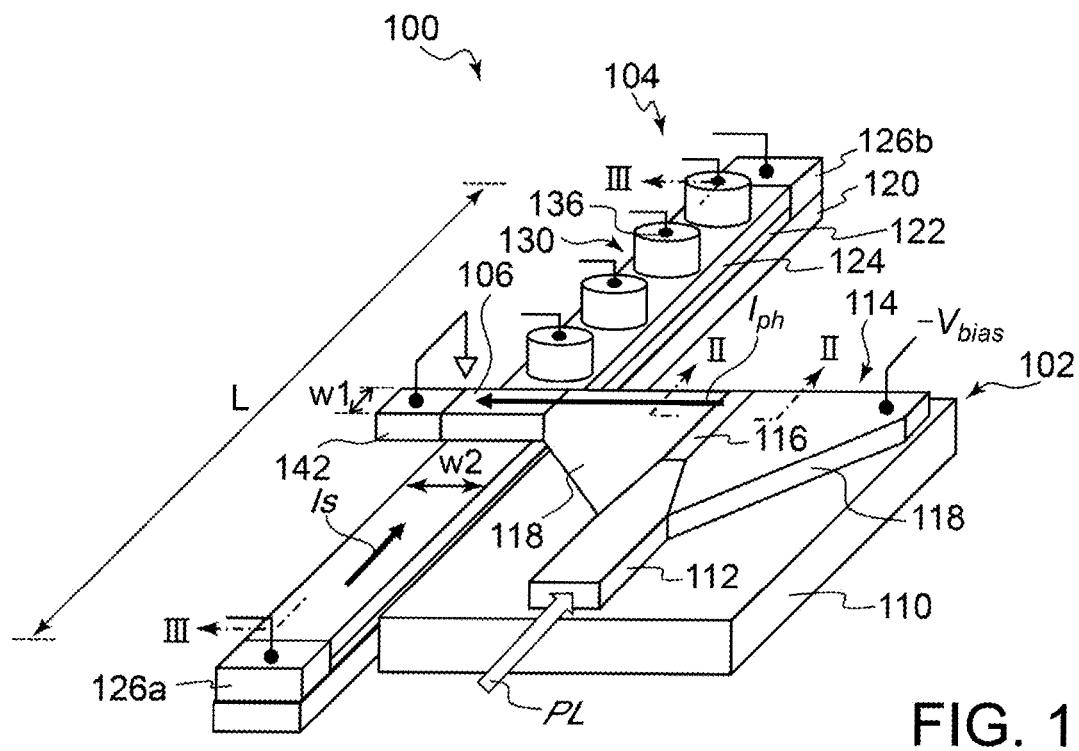
FIG. 1 is a perspective view illustrating a photonic spin register of a first embodiment of the invention.
Figure 2:
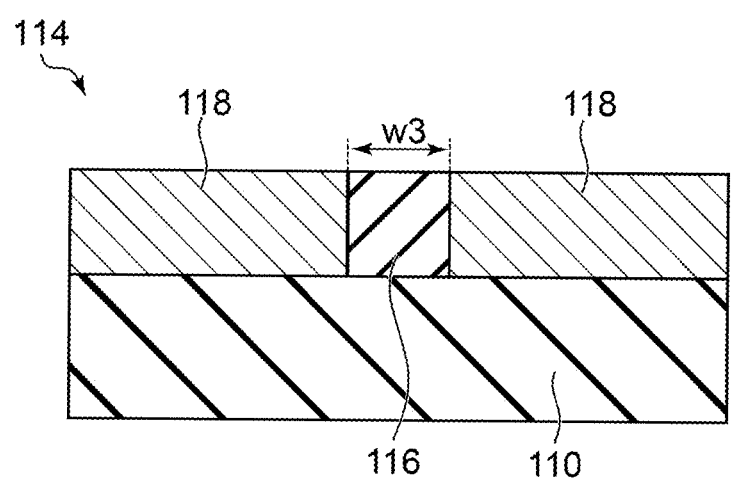
FIG. 2 is a cross-sectional view taken along line II-II of FIG. 1.
Figure 3:
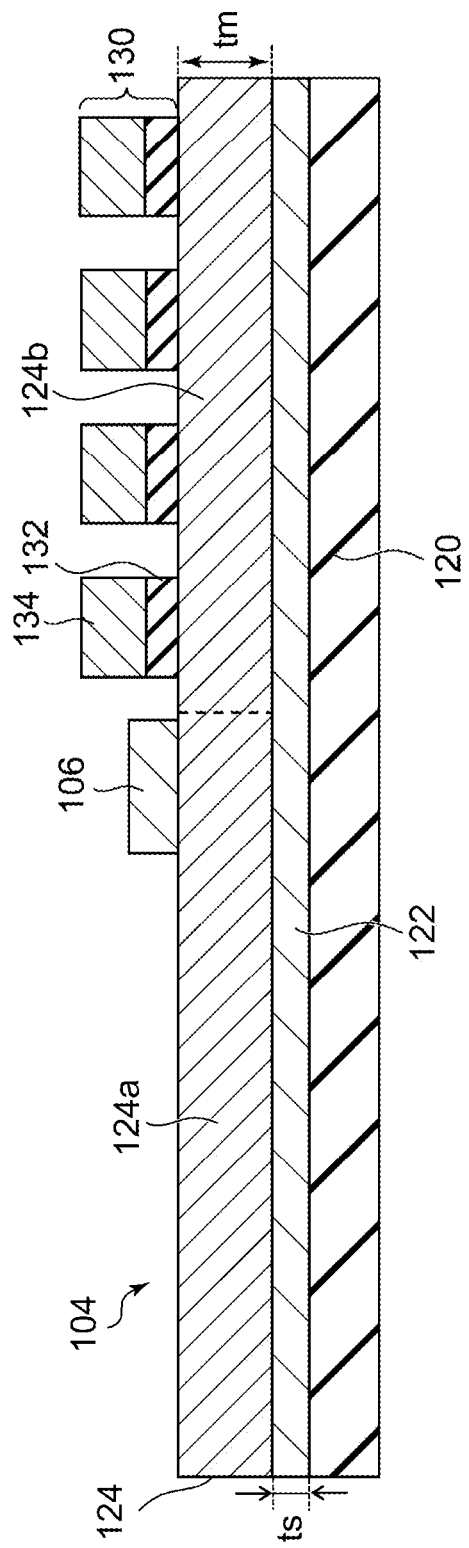
FIG. 3 is a cross-sectional view taken along line of FIG. 1.

First, a configuration of a photonic spin register 100 of the first embodiment will be described. FIG. 1 shows a perspective view of the photonic spin register 100, FIG. 2 shows a cross-sectional view taken along line II-II of FIG. 1, and FIG. 3 shows a cross-sectional view taken along line of FIG. 1.

The photonic spin register 100 is a serial-parallel converter which performs photoelectric conversion on an optical signal that is a pulse amplitude-modulated and serial input signal and outputs a plurality of electrical signals in parallel. As shown in FIG. 1, the photonic spin register 100 includes a light receiver 102, a shift register unit 104 having a shape extending in one direction, and a spin Hall material 106 serving as a write unit disposed on a partial region on the shift register unit 104.

The light receiver 102 includes a substrate 110 made of an insulator (e.g., $SiO_2$), an optical waveguide 112 disposed on the substrate 110, and a photodetector 114 connected to the optical waveguide 112 on the substrate 110. The photodetector 114 includes a photoelectric conversion element 116 and a pair of metal films 118 between which the photoelectric conversion element 116 is sandwiched, which constitutes a plasmon waveguide.

The photoelectric conversion element 116 is made of a dielectric material (semiconductor or insulator) and serially connected to the optical waveguide 112. The photoelectric conversion element 116 has a width w3 (See FIG. 2) narrower than that of the optical waveguide 112. The width of the optical waveguide 112 is tapered toward the photoelectric conversion element 116 at a connecting portion with the photoelectric conversion element 116. The metal films 118 on both sides of the photoelectric conversion element 116 are made of a metal material such as Au or Ag. The narrower the width w3 of the photoelectric conversion element 116 (e.g., w3=50 nm), the more increased a light confinement effect, which makes it possible to focus light to a smaller area than a diffraction limitation, and thereby enhances an interaction between the photoelectric conversion element 116 and an optical electric field. This leads to an increased light absorptivity, achieving a responsivity of about 1 A/W in an element length of 1 μm to 2 μm.

One of the metal films 118 of the photodetector 114 is connected to one end of the spin Hall material 106. The other of the metal films 118 further serves as an electrode to which a bias voltage $V_{bias}$ is applied. The other end of the spin Hall material 106 is connected to an electrode 142 which is grounded. The spin Hall material 106 is made of a heavy metal such as Pt or W which exhibits a spin Hall effect.

As shown in FIG. 3, the shift register unit 104 includes a substrate 120, a spin Hall layer 122 stacked on the substrate 120, and a magnetic material layer 124 stacked on the spin Hall layer 122. The spin Hall layer 122 is made of a heavy metal such as Pt or W which exhibits a spin Hall effect. The magnetic material layer 124 is made of a topological antiferromagnet with a composition of $Mn_3X$ (e.g., X is Sn) or a ferrimagnet (e.g., GdFeCo). For example, the spin Hall layer 122 has a thickness is of 4 nm, and the magnetic material layer 124 has a thickness tm of 6 nm.

The magnetic material layer 124 includes a first region 124a in which a magnetic order is fixed by a magnet in advance, and a second region 124b in which information on magnetic orders (spin information) written into the first region 124a by the spin Hall material 106 (as will be described later) is buffered. The spin Hall material 106 is stacked on the first region 124a and located closest to the second region 124b.

As shown in FIG. 1, on both ends of the spin Hall layer 122 and the magnetic material layer 124 in a longitudinal direction, a pair of electrodes 126a and 126b is connected. When a voltage is applied between the electrodes under control of a control unit, a shift current Is which is a direct current flows through the spin Hall layer 122 and the magnetic material layer 124 in the longitudinal direction, causing a domain wall in the magnetic material layer 124 to move. This allows the spin information to move from the first region 124a to the second region 124b and be buffered in the second region 124b.

On the second region 124b of the magnetic material layer 124, a plurality of read elements 130 are arranged in the longitudinal direction. Each read element 130 includes a barrier layer 132 stacked on the second region 124b and made of a non-magnetic material (e.g., MgO), and a fixed layer 134 stacked on the barrier layer 132 and having a magnetic order fixed in an out-of-plane direction. The fixed layer 134 is connected to a terminal 136 (See FIG. 1) for reading out the electrical signal. The second region 124b serves as a free layer having a reversible magnetic order. Hence, the second region 124b and the plurality of read elements 130 are combined to constitute a plurality of magnetoresistance elements (e.g., magnetic tunnel junction elements). The electrical signals based on pieces of spin information buffered in magnetic domains in the second region 124b are read out in parallel via the plurality of read elements 130 by a magnetoresistance effect. Although FIGS. 1 and 3 show four read elements 130 for reading out 4-bit data as an example, the number of the read elements 130 is not restrictive.

Next, a process from the input of an optical signal PL to the read-out of electrical signals executed by the photonic spin register 100 will be described with reference to FIGS. 1 and 4A to 4D. In the following description, each magnetic domain 128b in the magnetic material layer 124 is assumed to have a perpendicular magnetic order parallel to the out-of-plane direction, and the magnetic order of the first region 124a is assumed to be fixed in a downward direction in advance. Let the four read elements 130 shown in FIGS. 4A to 4D be denoted by 130a, 130b, 130c, and 130d in ascending order of distance from the spin Hall material 106. The magnetic order of the fixed layer 134 of each read element is assumed to be fixed in an upward direction. The data is defined as "1" when the magnetic order of the fixed layer 134 and the magnetic order of the magnetic domain 128b located immediately below the read element are parallel, and the data is defined as "0" when they are antiparallel.

When the optical signal PL that is a pulse amplitude-modulated and serial input signal is input into the photoelectric conversion element 116 via the optical waveguide 112, the optical signal PL propagates in the form of a surface plasmon polariton at an interface between the photoelectric conversion element 116 and the metal films 118, producing a strong electric field in the surrounding area. When the bias voltage $V_{bias}$ is applied, a photocurrent $I_{ph}$ that is a pulsed current flows from the photodetector 114 through the spin Hall material 106, and flows into the electrode 142.

Figure 4A:
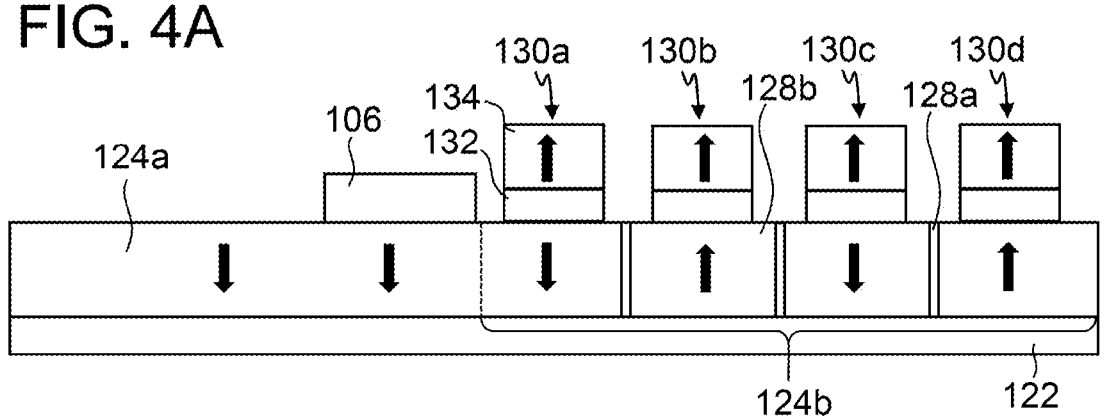
FIG. 4A is a schematic view illustrating one example of an initial magnetic order state of a magnetic material layer.
Figure 4B:
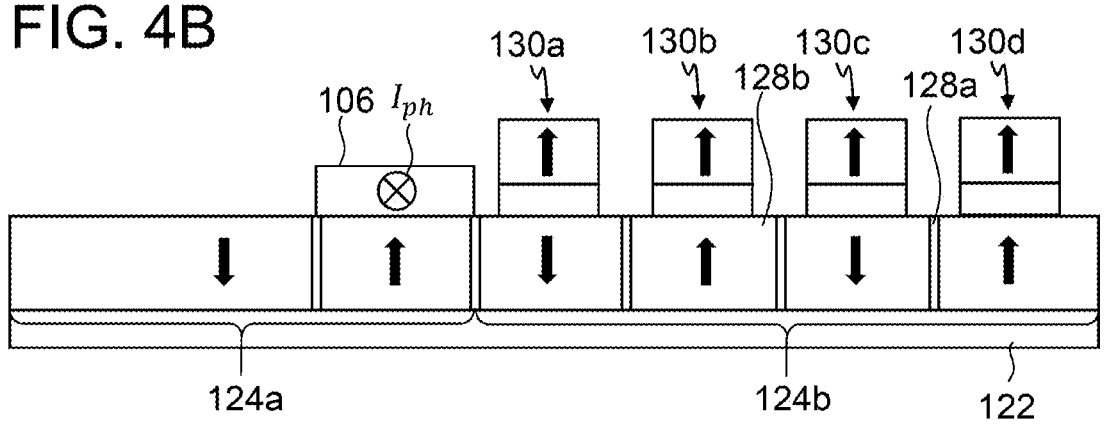
FIG. 4B is a schematic view illustrating a magnetic order state (spin information) when information included in an optical signal is written into a magnetic domain in the magnetic material layer by means of a photocurrent.
Figure 4C:
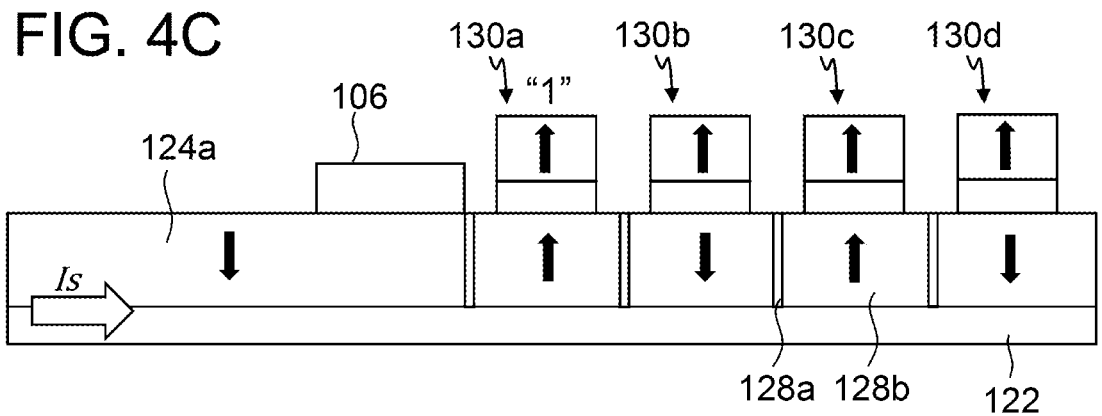
FIG. 4C is a schematic view illustrating a motion of a domain wall and a motion of the spin information which are caused by a shift current.

FIG. 4A shows one example of an initial magnetic order state of the magnetic material layer 124. In this initial state, when the photocurrent $I_{ph}$ flows through the spin Hall material 106, a spin current is generated in the spin Hall material 106 in the out-of-plane direction, which induces a spin-orbit torque (SOT) to act on the magnetic order of a partial region in the first region 124a located immediately below the spin Hall material 106, thereby allowing reversal of the magnetic order (See FIG. 4B). FIG. 4B shows an example in which the magnetic order of the partial region in the first region 124a is reversed from the downward direction to the upward direction, indicating that spin information corresponding to data "1" is written into the partial region.

Since the photocurrent $I_{ph}$ is a pulsed current based on information included in the optical signal PL, the magnetic order reversal occurs in a pulse width duration in which the current with a current density larger than a given value flows, and does not occur otherwise. In this way, by transferring the information included in the optical signal PL to a spin state of a magnetic domain in the first region 124a by means of the photocurrent $I_{ph}$, the 1-bit spin information is written into the magnetic domain.

After that, when the shift current Is flows through the spin Hall layer 122, SOT acts on the magnetic material layer 124, which causes domain walls 128a in the magnetic material layer 124 to move in a direction of the shift current Is. With this motion, the 1-bit spin information "1" moves to a location of the read element 130a, and the magnetic order of the magnetic domain in the first region 124a gets back to the initial state (See FIG. 4C). The first and subsequent embodiments allow a coherent domain wall motion.

The shift current Is flows also through the magnetic material layer 124, which induces a spin transfer torque (STT) that allows the domain walls 128a to move in a direction of an electron current (which is an opposite direction to the shift current Is). However, the spin Hall layer 122 has a significantly lower resistivity than the magnetic material layer 124. Hence, a much larger shift current Is flows through the spin Hall layer 122 than through the magnetic material layer 124 at thicknesses of is =4 nm and tm=6 nm as described above, and thus SOT is dominant over STT, allowing the domain walls 128a to move in the direction of the shift current Is.

Note that the spin Hall layer 122 may not necessarily be employed in the shift register unit 104. Without the spin Hall layer 122, when the shift current Is flows through the magnetic material layer 124 from the electrode 126b (from the second region 124b side) to the electrode 126a (to the first region 124a side), the domain walls 128a move in the opposite direction to the shift current Is due to STT.

Let us suppose that pieces of spin information "1," "0," "0," and "1" are written in this order by four times of writing the spin information by means of the photocurrent $I_{ph}$ and moving the domain walls 128a by means of the shift current Is. In this example, in the second region 124b, the first spin information "1" moves to a location of the read element 130d, the second spin information "0" moves to a location of the read element 130c, the third spin information "0" moves to a location of the read element 130b, and the fourth spin information "1" moves to a location of the read element 130a (See FIG. 4D).

Under control of the control unit, when a given voltage is applied to each of the magnetoresistance elements constituted by the read elements 130a to 130d and the second region 124b, a read current flows through each magnetoresistance element in the out-of-plane direction, and is output via the terminal 136. Since the magnitude of the read current varies depending on electrical resistance of the magnetoresistance element by a magnetoresistance effect, it is possible to distinguish between "1" and "0" depending on the magnitude of the output read current (electrical signal). For example, when the magnetic order of the fixed layer 134 and the magnetic order of the magnetic domain 128b located immediately below the read element are oriented in the same direction (parallel state), the magnetoresistance element is in a low-resistance state. When they are oriented in the opposite directions (anti-parallel state), the magnetoresistance element is in a high-resistance state. It is therefore possible to determine the former data to be "1" and the latter data to be "0."

If the domain wall 128a in the magnetic material layer 124 moves a 1-bit distance in 10 ps, 4-bit pieces of spin information are sequentially buffered in the second region 124b in 10 ps×4=40 ps. The control unit described above measures time using a clock, and controls the four read elements 130a to 130d such that four electrical signals corresponding to the 4-bit pieces of spin information can be read out at the same time after a lapse of 40 ps from the start of moving the first spin information. In this way, 4-bit pieces of data ("1001") can be read out in parallel.

Next, an explanation will be made of an energy consumed when the spin information is written into the magnetic domain in the magnetic material layer 124 and an energy consumed when the domain wall moves.

As shown in FIG. 1, let an area per 1-bit (bit size) of the shift register unit 104 be defined below by w1×w2 where w1 denotes a width of the spin Hall material 106 and w2 denotes a width of the shift register unit 104. The width w1 represents a moving distance of 1-bit. Let the thickness of the spin Hall material 106 through which the photocurrent $I_{ph}$ flows be 10 nm, the thickness is of the spin Hall layer 122 be 4 nm, and the thickness tm of the magnetic material layer 124 be 6 nm. Further, let a length of the magnetic material layer 124 and the spin Hall layer 122 in the longitudinal direction be denoted by L.

A recent study has reported that a magnetic order of a ferrimagnet can be reversed by applying a pulsed current of $7 \times 10^{12}$ A/m$^2$ for about 10 ps (Y. Yang et al., Science Advances, Vol. 3, e1603117 (2017)). A magnetic order of Mn$_3$Sn which is one of the topological antiferromagnets is expected to be reversed in several ps by means of a current in order of $10^{12}$ A/m$^2$. The current density required for the magnetic order reversal is nearly unchanged in a pulse width of about a damping rate.

Suppose that the magnetic material layer 124 is made of a ferrimagnet (e.g., GdFeCo), and the spin Hall material 106 has a bit size of 50 nm×50 nm and a bit resistance R of 50Ω. When the photocurrent $I_{ph}$ of $7 \times 10^{12}$ A/m$^2$ (3.5 mA) is applied for 9 ps to the spin Hall material 106, the consumption energy per 1-bit $I_{ph}^2$Rt (t denotes time) is $(3.5 \times 10^{-3})^2$ A$^2$×50 Ω×9 ps=5.5 fJ.

Suppose that the magnetic material layer 124 is made of a topological antiferromagnet (e.g., Mn$_3$Sn), and the spin Hall material 106 has a bit size of 100 nm×50 nm and a bit resistance R of 25Ω. When the photocurrent $I_{ph}$ of $7 \times 10^{12}$ A/m$^2$ (7 mA) is applied for 2 ps to the spin Hall material 106, the consumption energy per 1-bit $I_{ph}^2$Rt is $(7 \times 10^{-3})^2$ A$^x$2× 25 Ω×2 ps=2.5 fJ.

As described above, both the ferrimagnet and the topological antiferromagnet make it possible to reduce the consumption energy per 1-bit for writing the spin information to less than 10 fJ by means of an ultrashort pulsed current with a pulse width of 10 ps or less.

A recent study has reported that as for a domain wall motion, a domain wall velocity of a ferrimagnet reaches 4 km/s by means of a current in order of $10^{11}$ A/m$^2$ (K. Cai et al., Nature Electronics, Vol. 3, pages 37-42 (2020)). A domain wall velocity of Mn$_3$Sn is expected to reach 10 km/s by means of a current of $1 \times 10^{12}$ A/m$^2$ or less. That is, the domain wall motion at a domain wall velocity of several km/s or more is expectable by means of the shift current Is whose current density is one order of magnitude lower than the photocurrent $I_{ph}$ which is a write current.

Suppose that the magnetic material layer 124 is made of a ferrimagnet, the spin Hall layer 122 is made of Pt, the bit size is 50 nm×50 nm, and the length L in the longitudinal direction is 1000 nm (=1 μm). In this case, the shift register unit 104 has a resistance R of about 9000. If the domain wall velocity is 5 km/s, the domain wall moves the 1-bit distance w1 (=50 nm) in 10 ps. When the shift current Is of $5\times10^{11}$ A/m$^2$ (0.25 mA) is applied to the shift register unit 104 for 10 ps in the longitudinal direction, the consumption energy per 1-bit Is$^2$Rt is $(2.5\times10^{-4})^2$ A$^2$×9000×10 ps=0.5 fJ.

Suppose that the magnetic material layer 124 is made of a topological antiferromagnet, the spin Hall layer 122 is made of Pt, the bit size is 100 nm×50 nm, and the length L in the longitudinal direction is 2000 nm (=2 μm). In this case, the shift register unit 104 has a resistance R of about 1800 Ω. If the domain wall velocity is 10 km/s, the domain wall moves the 1-bit distance w1 (=100 nm) in 10 ps. When the shift current Is of $1\times10^{12}$ A/m$^2$ (0.5 mA) is applied to the shift register unit 104 for 10 ps in the longitudinal direction, the consumption energy per 1-bit Is$^2$Rt is $(5\times10^{-4})^2$ A$^2$×1800 Ω×10 ps=4.5 FJ.

As described above, both the ferrimagnet and the topological antiferromagnet make it possible to reduce the consumption energy per 1-bit for the current-induced domain wall motion to several fJ.

Although the plasmon waveguide photodetector is illustrated as an example of the photodetector 114 in the above-described first embodiment, alternative photoelectric conversion devices for converting the input optical signal PL into the photocurrent $I_{ph}$ may be employed.

The shift current Is is illustrated as a direct current but may also be a pulsed current generated from the optical signal PL. In the case of the pulsed current, the optical signal PL is split into two optical signals by an optical splitter, one optical signal PL is input into the light receiver 102, and the other optical signal PL is input into a photoelectric conversion device such as a photodiode to generate the pulsed current. The generated pulsed current may be applied as the shift current Is to the shift register unit 104.

Next, differences between conventional photoelectric interfaces and a photoelectric interface of the first embodiment will be described with reference to FIGS. 5A to 5C.

As shown in FIG. 5A, a photodetector such as a photodiode absorbs an optical signal and outputs a photocurrent $I_{ph}$, and the photocurrent $I_{ph}$ needs to be converted into a voltage for signal processing in a large-scale integration (LSI). For this reason, the photocurrent $I_{ph}$ is amplified and converted into the voltage using a transimpedance amplifier (TIA) to output the resulting voltage $V_{out}$. However, TIA has performance issues regarding speed of operation, power consumption, sensibility (noise), and so on.

On the other hand, as shown in FIG. 5B, there is another technique using a load resistor (with a resistance value $R_{load}$) instead of TIA. In this technique, the photocurrent $I_{ph}$ from the photodetector flows through the load resistor, and thus the voltage $V_{out}$ ($=R_{load}I_{ph}$) can be read due to voltage drop that occurs in the load resistor. However, in order to obtain the voltage $V_{out}$ of 1V used for LSI, a large load resistance of about 10 kΩ is required. The increased load resistance leads to a reduction in speed of operation which is determined by the RC time constant. For a high-speed operation, a parasitic capacitance of the photodetector needs to be 1 fF or less. For example, Nozaki et al. (Nature Photonics, volume 13, pages 454-459 (2019)) discloses that a photodetector utilizing a photonic crystal structure makes it possible to achieve an exceedingly small parasitic capacitance of about 1 fF. This technique, however, requires a current-to-voltage conversion and a high load resistance of 24 kΩ, and thus the speed of operation does not extend beyond several tens of GHz.

Figure 5C:
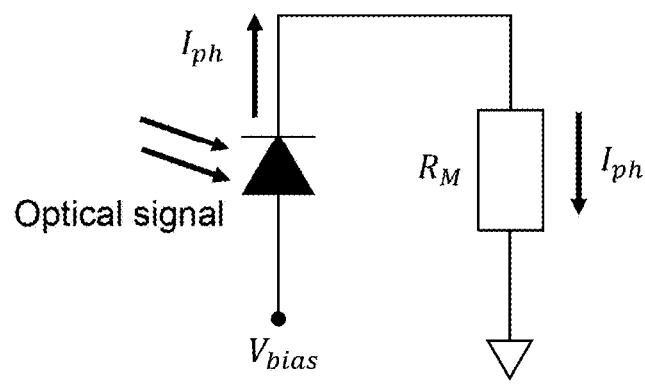
FIG. 5C is a schematic view demonstrating a concept of a photoelectric interface of the first embodiment of the invention.

As shown in FIG. 5C, the photonic spin register 100 of the first embodiment does not require the current-to-voltage conversion, allowing reversal of the magnetic order of the magnetic material layer by the photocurrent $I_{ph}$ from the photodetector, thereby transferring information included in the optical signal to a spin state. Therefore, an effective resistance value $R_M$ of a load resistor can be reduced to less than 100Ω, and thus a significantly improved speed of operation can be expected. For example, using a combination of the photodetector with a parasitic capacitance of about 1 fF and the load resistor with about 100Ω, the speed of operation determined by the RC time constant reaches close to 1 THz.

Although FIGS. 1 to 3 show an example in which the substrate 120 of the shift register unit 104 and the substrate 110 of the light receiver 102 are provided separately, functions of both the shift register unit 104 and the light receiver 102 may be implemented on a single substrate.

Figure 6:
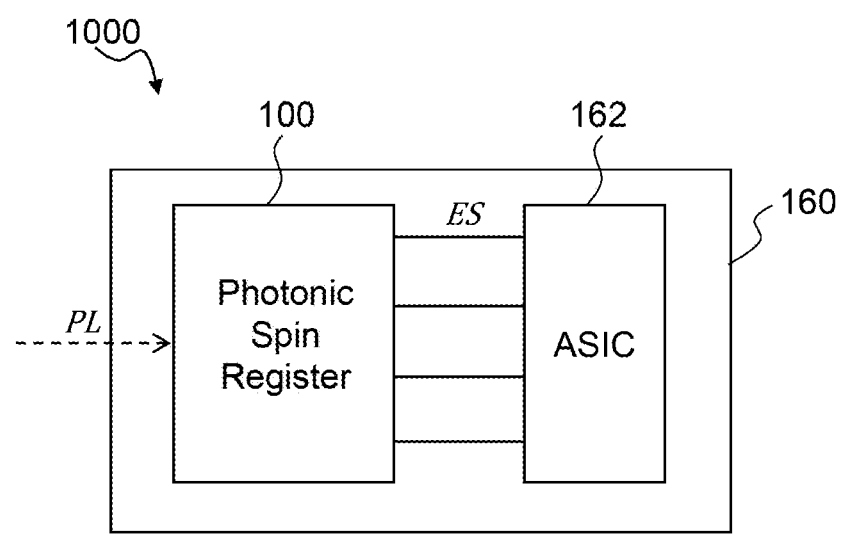
FIG. 6 is a functional block diagram illustrating one example of an on-chip device that implements a function of the photonic spin register of the first embodiment.

Moreover, functions of the photonic spin register 100 and another device may be implemented on a single substrate. For example, as shown in FIG. 6, it is possible to realize an on-chip device 1000 in which functions of the photonic spin register 100 and an application-specific integrated circuit (ASIC) 162 are implemented on a single substrate 160. In the on-chip device 1000, an optical signal PL is input in series to the photonic spin register 100, and a plurality of electrical signals ES are output in parallel from the photonic spin register 100 to the ASIC 162.

Second Embodiment

A second embodiment of the invention will be described with reference to FIG. 7. The second embodiment is directed to a photonic spin register having a plurality of shift register units, each of which is defined as the shift register unit of the first embodiment.

Figure 7:
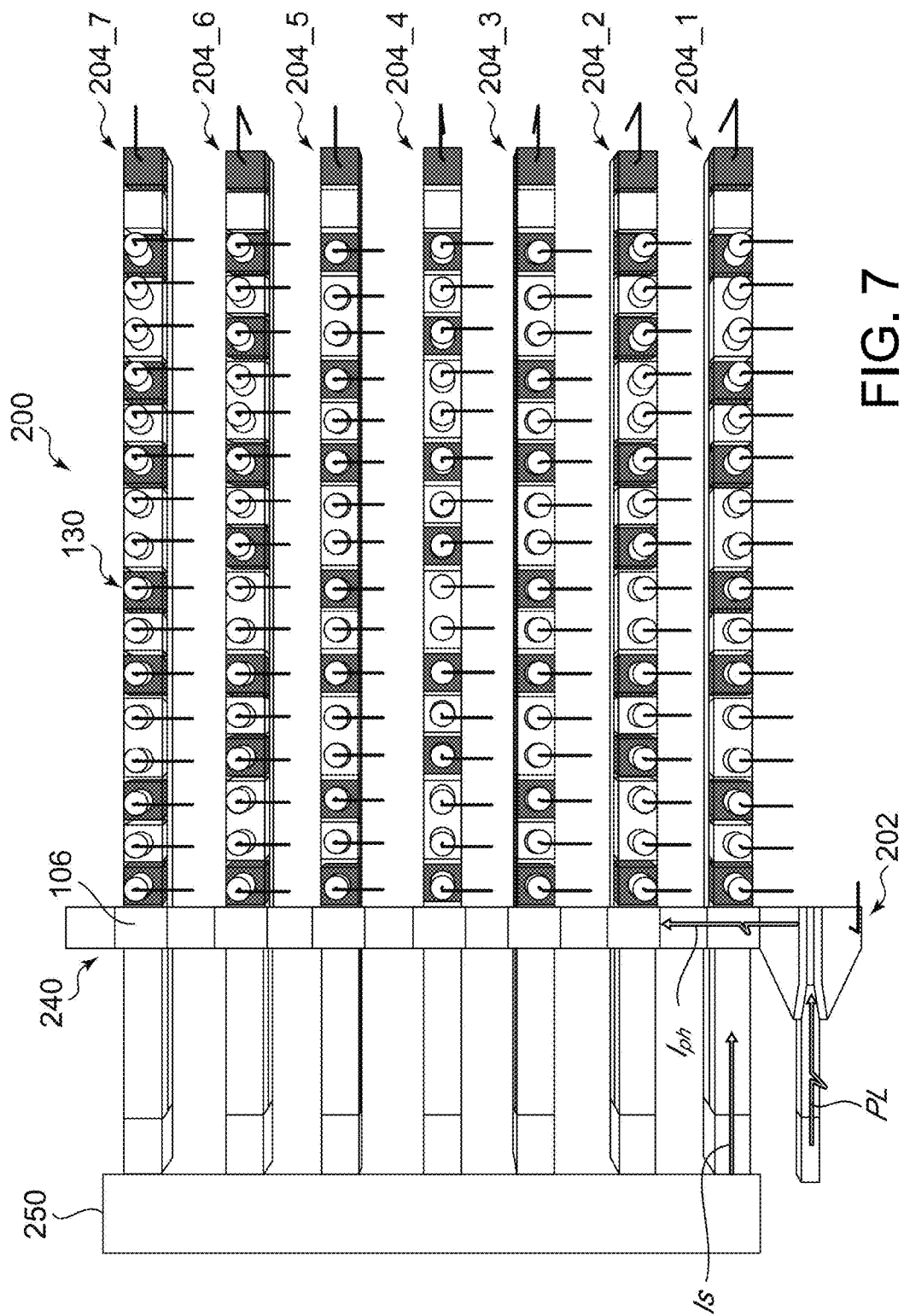
FIG. 7 is a schematic view illustrating a configuration of a photonic spin register of a second embodiment of the invention.

As shown in FIG. 7, a photonic spin register 200 of the second embodiment includes a light receiver 202, a first shift register unit 204_1 to a seventh shift register unit 204_7, a write unit 240, and a control unit 250.

The light receiver 202 has the same structure as the light receiver 102 of the first embodiment. The first shift register unit 204_1 to the seventh shift register unit 204_7 are arranged in parallel in a direction perpendicular to a longitudinal direction. Although FIG. 7 shows an example of seven shift register units, the number of the shift register units is not restrictive. Each shift register unit has the same structure as the shift register unit 104 of the first embodiment (FIG. 3) in which the substrate 120, the spin Hall layer 122, and the magnetic material layer 124 are stacked.

On the second region 124b of the magnetic material layer 124 of each shift register unit, a plurality of read elements 130 are arranged in the longitudinal direction. Although FIG. 7 shows an example of sixteen read elements 130, the number of the read elements 130 is not restrictive.

A spin Hall material 106 is stacked on the first region 124a of the magnetic material layer 124 and located closest to the second region 124b. The spin Hall materials 106 on the adjacent shift register units are electrically connected to each other, thereby constituting the write unit 240. Thus, the write unit 240 is disposed on and intersecting the first shift register unit 204_1 to the seventh shift register unit 204_7.

The light receiver 202 is directly connected to the spin Hall material 106 on the first shift register unit 204_1. A photocurrent $I_{ph}$ from the light receiver 202 flows throughout the write unit 240 and flows into an electrode connected to the spin Hall material 106 on the seventh shift register unit 204_7.

The control unit 250 is electrically connected to the first shift register unit 204_1 to the seventh shift register unit 204_7, and selects a shift register unit through which a shift current Is is allowed to flow. The control unit 250 controls timing of reading a plurality of electrical signals via the plurality of read elements 130, respectively.

Next, a process from the input of an optical signal PL to the read-out of electrical signals executed by the photonic spin register 200 will be described.

When the optical signal PL that is a pulse amplitude-modulated and serial input signal is input into the light receiver 202, the photocurrent $I_{ph}$ is generated by a photodetector of the light receiver 202 and flows to the write unit 240. When the photocurrent $I_{ph}$ flows through the spin Hall material 106 on the first shift register unit 204_1, a spin current is generated in the spin Hall material 106 in the out-of-plane direction, which induces SOT to act on a magnetic order of a partial region in the first region 124a located immediately below the spin Hall material 106, thereby allowing 1-bit spin information to be written into a magnetic domain. The control unit 250 then allows the shift current Is to flow through only the first shift register unit 204_1, and the shift current Is causes a domain wall to move, thereby allowing the spin information written into the magnetic domain to move.

As described in the first embodiment, a current density of the shift current Is is set such that the domain wall in the magnetic material layer 124 can move a 1-bit distance in 10 ps. By sixteen times of writing the spin information by means of the photocurrent $I_{ph}$ and moving the domain wall by means of the shift current Is, 16-bit pieces of spin information are sequentially buffered in the second region 124b in 10 ps×16=160 ps. The control unit 250 measures time using a clock, and controls the sixteen read elements 130 such that sixteen electrical signals corresponding to the 16-bit pieces of spin information can be read out in parallel after a lapse of 160 ps from the start of moving the first spin information.

Upon completion of writing the 16-bit pieces of spin information into the first shift register unit 204_1, the control unit 250 stops the supply of the shift current Is to the first shift register unit 204_1, and allows the shift current Is to flow through the second shift register unit 204_2. Similarly, upon completion of writing 16-bit pieces of spin information into the second shift register unit 204_2, the control unit 250 stops the supply of the shift current Is to the second shift register unit 204_2, and allows the shift current Is to flow through the third shift register unit 204_3. Similarly, pieces of spin information are written into the third shift register unit 204_3 to the seventh shift register unit 204_7. Upon completion of writing 16-bit pieces of spin information into the seventh shift register unit 204_7, overwriting of the pieces of spin information in the first shift register unit 204_1 starts.

From the completion of writing the 16-bit pieces of spin information into the first shift register unit 204_1 until the completion of writing the 16-bit pieces of spin information into the seventh shift register unit 204_7, 160 ps×6 (~1 ns) is required. The 16-bit electrical signals are read out in parallel in about 1 ns via the sixteen read elements 130 on the first shift register unit 204_1, respectively. That is, while writing the pieces of spin information into the second shift register unit 204_2 to the seventh shift register unit 204_7 (in about 1 ns), the 16-bit electrical signals are read out in parallel from the first shift register unit 204_1.

In each shift register unit, 1-bit data is transmitted in 10 ps, and its transmission rate is 100 Gbps. In contrast, a CMOS circuit has a transmission rate of only 1 Gbps (1 ns per bit) which is one-hundredth of that of each shift register unit. Therefore, when the electrical signals are output to the CMOS circuit, the 16-bit electrical signals are read out in parallel in about 1 ns from the first shift register unit 204_1 in conformity with the transmission rate of the CMOS circuit. About 1 ns during which the electrical signals are read out from the first shift register unit 204_1 is utilized for writing the pieces of spin information into the other six shift register units (i.e., the second shift register unit 204_2 to the seventh shift register unit 204_7). Similarly, while 16-bit electrical signals are read out in parallel from the second shift register unit 204_2, pieces of spin information are written into the other six shift register units (i.e., the third shift register unit 204_3 to the seventh shift register unit 204_7, and the first shift register unit 204_1). The same holds true for reading out of 16-bit electrical signals from each of the third shift register unit 204_3 to the seventh shift register unit 204_7.

As described above, the photonic spin register 200 of the second embodiment makes it possible to efficiently write the pieces of spin information and read out the electrical signals by taking advantage of the difference in transmission rate between each shift register unit and the CMOS circuit.

Third Embodiment

A third embodiment of the invention will be described with reference to FIG. 8. The third embodiment is directed to a photonic spin register utilizing all-optical magnetization switching (AOS) in which a magnetic material layer is irradiated directly with an input optical signal to reverse magnetization (magnetic order).

Figure 8:
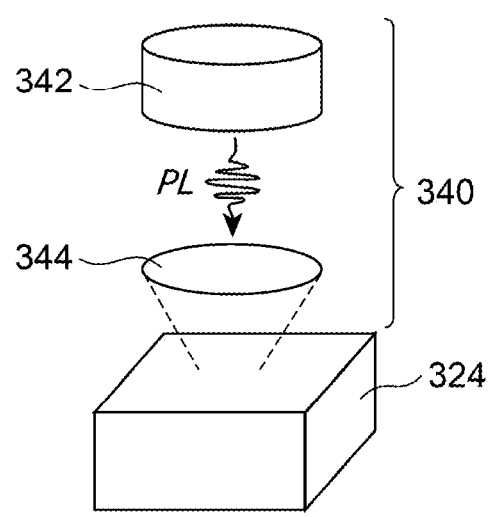
FIG. 8 is a schematic view illustrating a light irradiation unit and a part of a magnetic material layer of a photonic spin register of a third embodiment of the invention.

As shown in FIG. 8, the photonic spin register of the third embodiment includes a light irradiation unit 340 serving as a write unit which directly irradiates a magnetic material layer 324 made of a ferrimagnet with an optical signal PL that is a pulse amplitude-modulated and serial input signal. This configuration does not require a photodetector which is employed in the first and second embodiments. The structure of the photonic spin register of the third embodiment is obtained by replacing the light receiver 102 and the spin Hall material 106 of the photonic spin register 100 of the first embodiment with the light irradiation unit 340 shown in FIG. 8.

The light irradiation unit 340 includes a light emission unit 342 and a lens 344. The light emission unit 342 emits the optical signal PL that is an ultrashort pulsed light with a pulse width of about 100 fs. The optical signal PL emitted from the light emission unit 342 is focused into the magnetic material layer 324 by the lens 344. Since the optical signal PL is a pulsed light, reversal of the magnetic order of a magnetic domain in the magnetic material layer 324 occurs when the magnetic material layer 324 is irradiated with light with an intensity equal to or greater than a threshold, and the magnetic order reversal does not occur when the magnetic material layer 324 is irradiated with light with an intensity less than the threshold. In this way, by transferring information included in the optical signal PL to a spin state of the magnetic domain in the magnetic material layer 324, 1-bit spin information is written into the magnetic domain.

According to the photonic spin register of the third embodiment, there is no need to convert the optical signal PL into a photocurrent, and a magnetic order of the magnetic material layer 324 can be controlled directly with light. This leads to a total suppression of power consumption due to the photocurrent.

Note that the magnetic material layer 324 may be a composite film in which the ferrimagnet is stacked on a topological antiferromagnet.

Fourth Embodiment

A fourth embodiment of the invention will be described with reference to FIGS. 9 to 12D. The fourth embodiment is directed to a photonic spin register that converts a plurality of electrical signals input in parallel into a serial optical signal.

Figure 9:
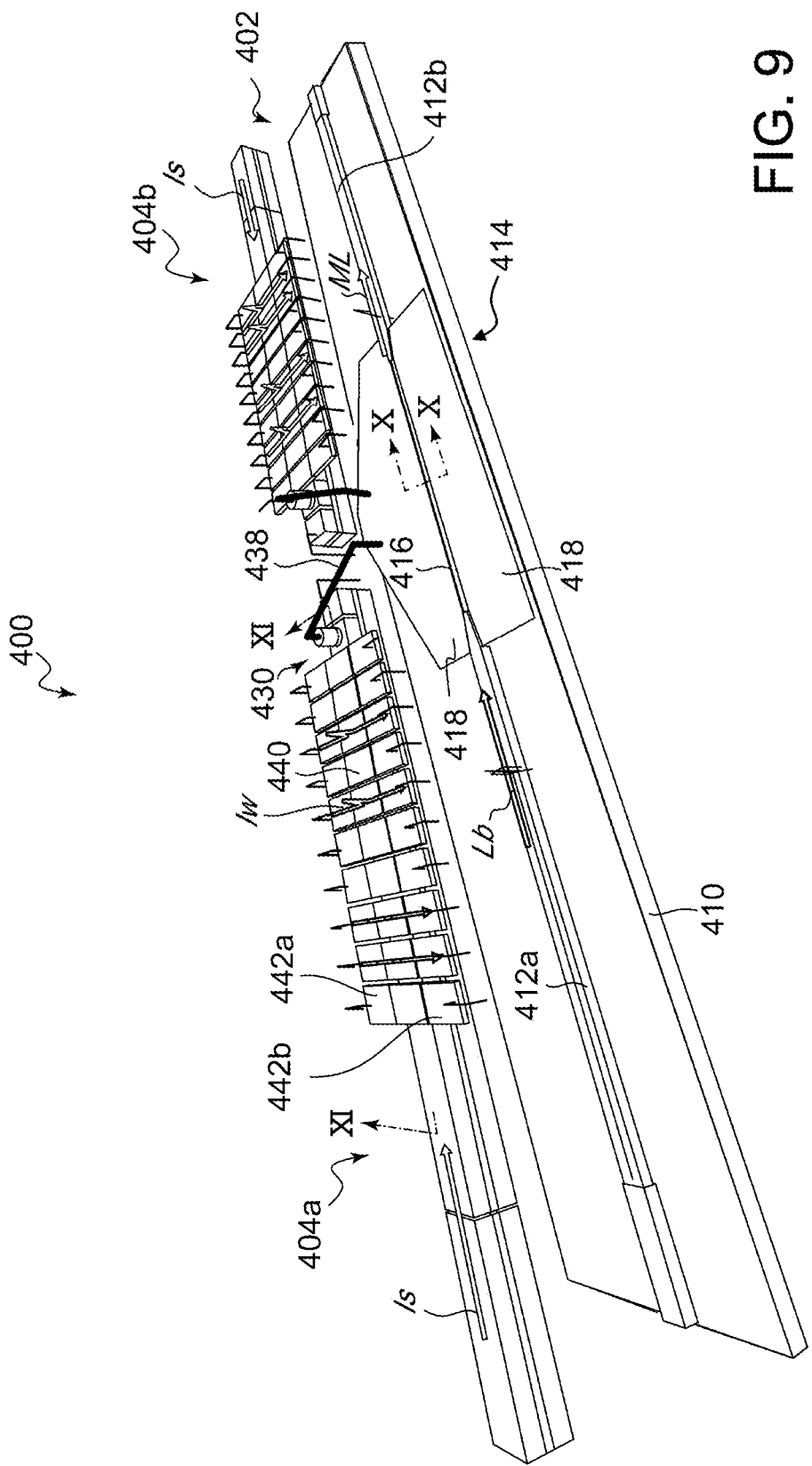
FIG. 9 is a perspective view illustrating a photonic spin register of a fourth embodiment of the invention.
Figure 10:
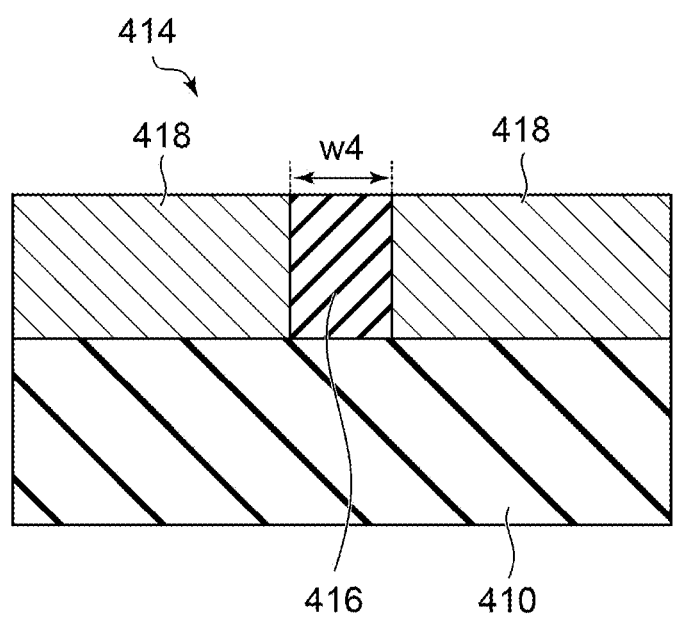
FIG. 10 is a cross-sectional view taken along line X-X of FIG. 9.
Figure 11:
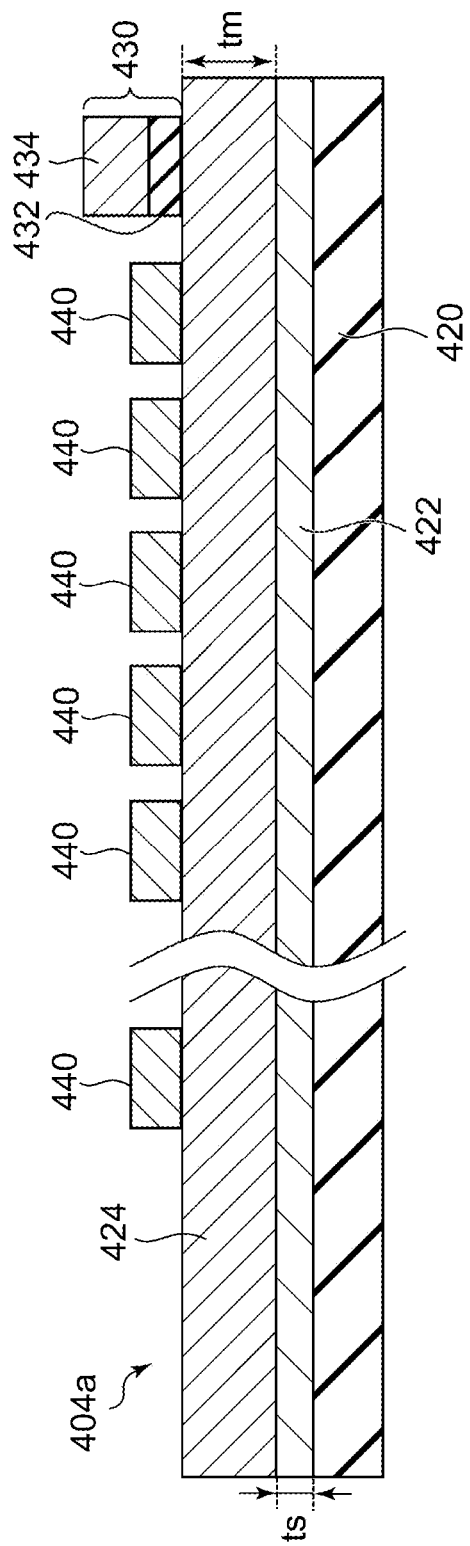
FIG. 11 is a cross-sectional view taken along line XI-XI of FIG. 9.

First, a configuration of a photonic spin register 400 of the fourth embodiment will be described. FIG. 9 shows a perspective view of the photonic spin register 400, FIG. 10 shows a cross-sectional view taken along line X-X of FIG. 9, and FIG. 11 shows a cross-sectional view taken along line XI-XI of FIG. 9.

As shown in FIG. 9, the photonic spin register 400 includes an optical signal output unit 402, and a first shift register unit 404a and a second shift register unit 404b, both of which have a shape extending in one direction. On each shift register unit, a plurality of spin Hall materials 440 serving as a write unit are arranged in a longitudinal direction, and a single read element 430 is disposed so as to be adjacent to the plurality of spin Hall materials 440. Although FIG. 9 shows an example in which ten spin Hall materials 440 for writing 10-bit data are arranged on each of the first shift register unit 404a and the second shift register unit 404b, the number of the spin Hall materials 440 is not restrictive.

The optical signal output unit 402 includes a substrate 410, an optical modulator 414 disposed on the substrate 410, and an input waveguide 412a and an output waveguide 412b, both of which are disposed on the substrate 410 and connected to the optical modulator 414. The optical modulator 414 includes an electro-optical element 416 and a pair of metal films 418 between which the electro-optical element 416 is sandwiched, which constitutes a plasmon waveguide.

The electro-optical element 416 is made of an electro-optic (EO) polymer. The metal films 418 on both sides of the electro-optical element 416 are made of a metal material such as Au or Ag. The electro-optical element 416 has one end serially connected to the input waveguide 412a and the other end serially connected to the output waveguide 412b. The electro-optical element 416 has a width w4 (See FIG. 10) narrower than that of the input waveguide 412a and the output waveguide 412b. The input waveguide 412a is tapered toward the electro-optical element 416 at a connecting portion with the electro-optical element 416. The output waveguide 412b is tapered toward the electro-optical element 416 at a connecting portion with the electro-optical element 416. The narrower the width w4 of the electro-optical element 416, the more increased a light confinement effect, which makes it possible to focus light to a smaller area than a diffraction limitation, and thereby enhances an interaction between the electro-optical element 416 and an optical electric field. This enhances the Pockels effect as described later and allows highly efficient optical modulation.

Because the first shift register unit 404a and the second shift register unit 404b share the same size and configuration, only the configuration of the first shift register unit 404a will be described below. As shown in FIG. 11, the first shift register unit 404a includes a substrate 420, a spin Hall layer 422 stacked on the substrate 420, and a magnetic material layer 424 stacked on the spin Hall layer 422. A material and a thickness of the spin Hall layer 422 and the magnetic material layer 424 are the same as those of the spin Hall layer 122 and the magnetic material layer 124 shown in FIG. 3, respectively. A magnetic order of the magnetic material layer 424 is fixed by a magnet in advance.

On the magnetic material layer 424, the plurality of spin Hall materials 440 are arranged in the longitudinal direction. A material and a bit size of each spin Hall material 440 are the same as those of the spin Hall material 106 shown in FIGS. 1 and 3. Each spin Hall material 440 is sandwiched between a pair of electrodes 442a and 442b, and a write current Iw flows from the electrode 442a to the electrode 442b under control of a control unit. When the write current Iw flows through the spin Hall material 440, SOT acts on the magnetic order of the magnetic material layer 424 located immediately below the spin Hall material 440, allowing spin information to be written as information on the magnetic order into the magnetic material layer 424.

Because the write current Iw is a pulsed current based on input information ("1" or "0") from a CMOS circuit or other such circuit, reversal of the magnetic order of a magnetic domain in the magnetic material layer 424 occurs in a pulse width duration in which the current with a current density larger than a given value flows, and does not occur otherwise. In this way, by transferring the input information to a spin state of the magnetic domain in the magnetic material layer 424 by means of the write current Iw, 1-bit spin information is written into the magnetic domain.

Just like the shift register unit 104 shown in FIG. 1, a pair of electrodes is connected on both ends of the spin Hall layer 422 and the magnetic material layer 424 in a longitudinal direction. When a voltage is applied between the electrodes under control of the control unit, a shift current Is flows through the spin Hall layer 422 and the magnetic material layer 424 in the longitudinal direction, causing domain walls in the magnetic material layer 424 to move. This allows a plurality of pieces of spin information written into the magnetic material layer 424 in parallel by the plurality of spin Hall materials 440 to move all together.

The read element 430 includes a barrier layer 432 stacked on the magnetic material layer 424 and made of a non-magnetic material, and a fixed layer 434 stacked on the barrier layer 432 and having a magnetic order fixed in an out-of-plane direction. The magnetic material layer 424 serves as a free layer having a reversible magnetic order. Hence, the magnetic material layer 424 and the read element 430 are combined to constitute a magnetoresistance element (e.g., a magnetic tunnel junction element). When a given voltage is applied to the magnetoresistance element under control of the control unit, the plurality of pieces of spin information moving in the magnetic material layer 424 are read out in series as an electrical signal by a magnetoresistance effect. The read element 430 is connected to one of the metal films 418 of the optical modulator 414 via a conductive wire 438.

Next, a process from parallel input of the electrical signals to serial output of the optical signal executed by the photonic spin register 400 will be described with reference to FIGS. 12A to 12D. An example is given below in which 10-bit pieces of information are written, in parallel at a time, into each of the first shift register unit 404a and the second shift register unit 404b, but this should not be understood as restrictive.

Figure 12A:
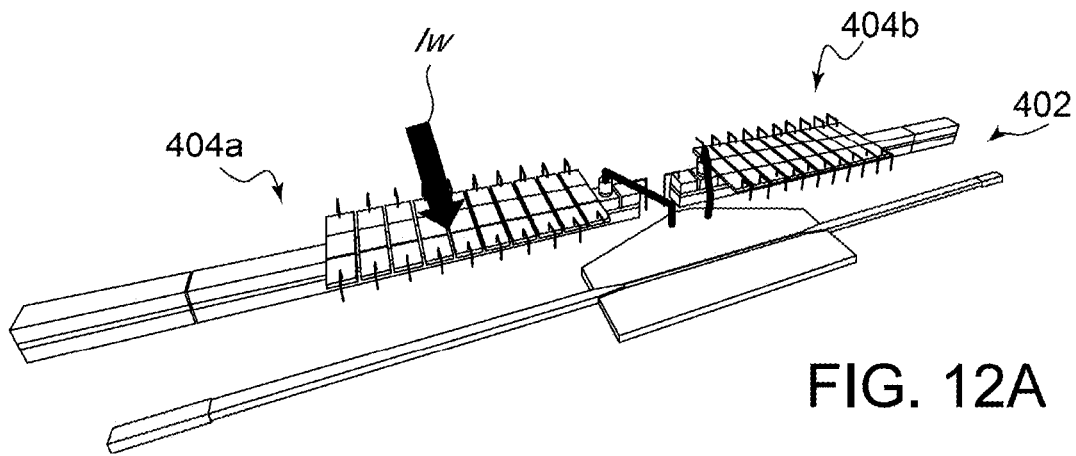
FIG. 12A is a schematic view demonstrating an operation of the photonic spin register of the fourth embodiment.

First, as shown in FIGS. 12A and 11, the write currents Iw based on pieces of input information flow at the same time through the spin Hall materials 440 of the first shift register unit 404a. This induces SOT to act on the magnetic order of the magnetic material layer 424 from each spin Hall material 440, thereby allowing 10-bit pieces of spin information to be written into the magnetic material layer 424. For example, 100 ps is required for writing the pieces of spin information into the magnetic material layer 424.

Figure 12B:
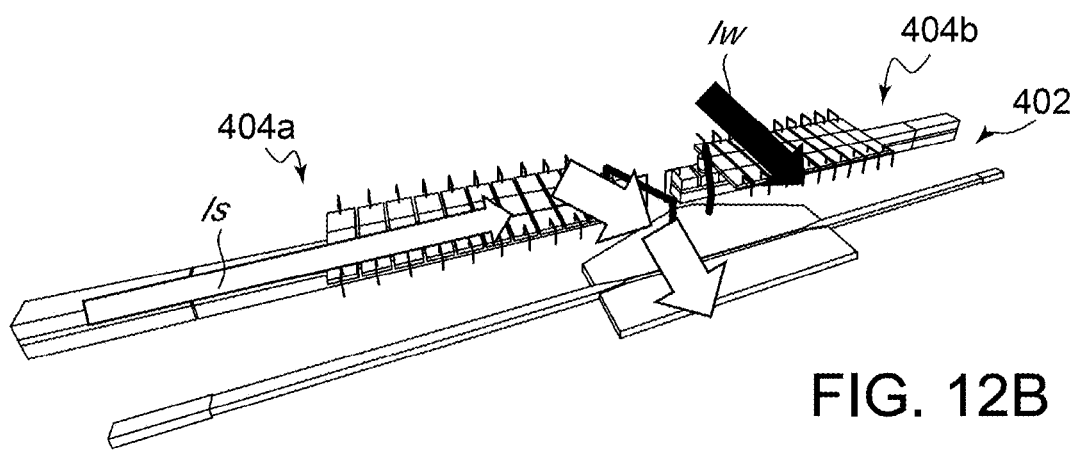
FIG. 12B is a schematic view demonstrating the operation of the photonic spin register of the fourth embodiment.

Next, as shown in FIGS. 12B and 11, when the shift current Is flows through the spin Hall layer 422 and the magnetic material layer 424 of the first shift register unit 404a, domain walls in the magnetic material layer 424 move in the longitudinal direction, and the pieces of spin information written into the magnetic material layer 424 move. If the domain wall in magnetic material layer 424 moves a 1-bit distance in 10 ps, the 10-bit pieces of spin information move in 100 ps, and the electrical signal is read out sequentially from the read element 430. That is, the electrical signal is transmitted from the read element 430 to the optical modulator 414 at a transmission rate of 100 Gbps.

As shown in FIG. 9, when a voltage corresponding to the electrical signal from the read element 430 is applied to the optical modulator 414, an incident light Lb from the input waveguide 412a is phase-modulated by the Pockels effect, and a modulated light ML is output to the output waveguide 412b.

While the shift current Is is flowing through the first shift register unit 404a, write currents Iw flow through the spin Hall materials 440 of the second shift register unit 404b. This allows 10-bit pieces of spin information to be written into the magnetic material layer 424 due to SOT at the same time.

Figure 12C:
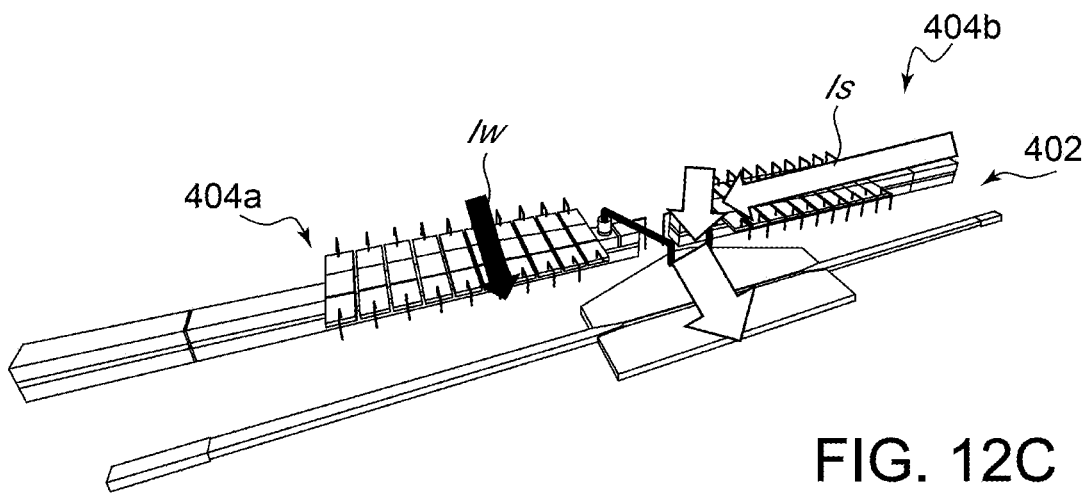
FIG. 12C is a schematic view demonstrating the operation of the photonic spin register of the fourth embodiment.

Next, as shown in FIGS. 12C, 9 and 11, when write currents Iw flow through the spin Hall materials 440 of the first shift register unit 404a, 10-bit pieces of spin information are written into the magnetic material layer 424 due to SOT at the same time. While the pieces of spin information are being written into the first shift register unit 404a, the shift current Is flows through the second shift register unit 404b. This allows the 10-bit pieces of spin information to be read out in series as an electrical signal from the read element 430 of the second shift register unit 404b, and the electrical signal is transmitted to the optical modulator 414. The optical modulator 414 converts the electrical signal into an optical signal, and outputs a modulated light ML.

Figure 12D:
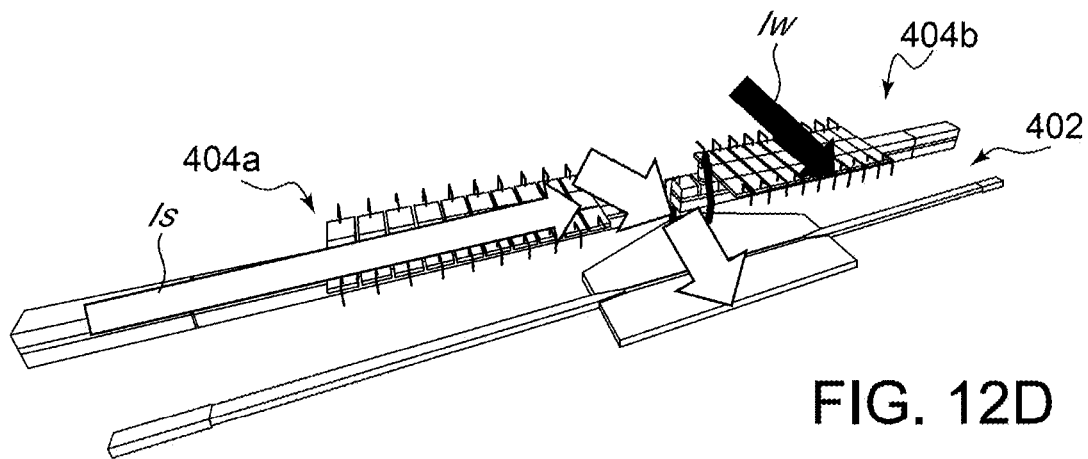
FIG. 12D is a schematic view demonstrating the operation of the photonic spin register of the fourth embodiment.

Next, as shown in FIGS. 12D, 9, and 11, the shift current Is flows through the first shift register unit 404a. This allows the 10-bit pieces of spin information to be read out in series as an electrical signal from the read element 430 of the first shift register unit 404a, and the electrical signal is transmitted to the optical modulator 414. The optical modulator 414 converts the electrical signal into an optical signal, and outputs a modulated light ML. At the same moment, write currents Iw flow through the spin Hall materials 440 of the second shift register unit 404b, which allows 10-bit pieces of spin information to be written into the magnetic material layer 424 due to SOT at the same time.

In this way, the pieces of spin information are written into the first shift register unit 404a while the electrical signal is read out from the second shift register unit 404b, and the pieces of spin information are written into the second shift register unit 404b while the electrical signal is read out from the first shift register unit 404a.

According to the photonic spin register 400 of the fourth embodiment, as is the case with the photonic spin register 100 of the first embodiment, it is possible to reduce the consumption energy per 1-bit for writing the spin information into the magnetic domain in the magnetic material layer 424 and the consumption energy per 1-bit for the domain wall motion to the order of several fJ. Moreover, it is possible to achieve a high-speed transmission rate of 100 Gbps as described above.

Although FIGS. 9 to 11 show an example in which the substrate 420 of the first shift register unit 404a, the substrate 420 of the second shift register unit 404b, and the substrate 410 of the optical signal output unit 402 are provided separately, functions of each shift register unit and the optical signal output unit 402 may be implemented on a single substrate.

Figure 13:
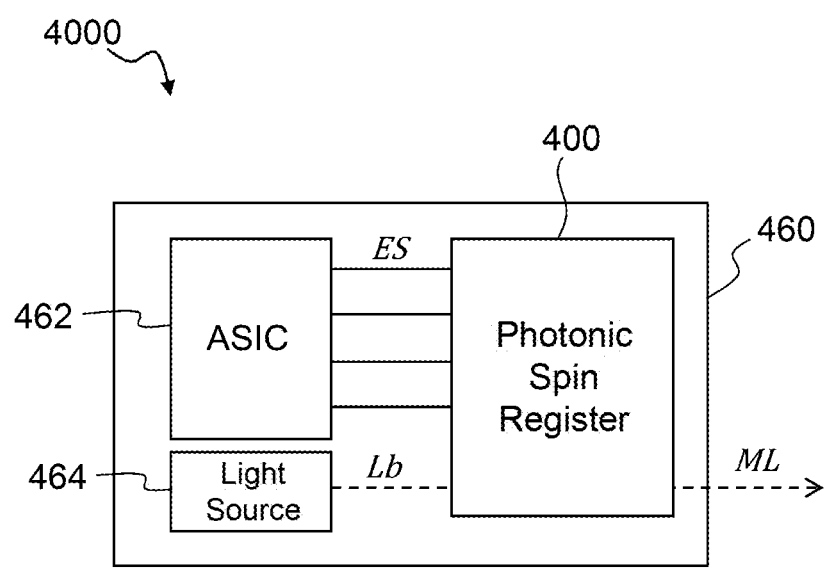
FIG. 13 is a functional block diagram illustrating one example of an on-chip device that implements a function of the photonic spin register of the fourth embodiment.

Moreover, functions of the photonic spin register 400 and another device may be implemented on a single substrate. For example, as shown in FIG. 13, it is possible to realize an on-chip device 4000 in which functions of the photonic spin register 400, an ASIC 462, and a light source 464 are implemented on a single substrate 460. In the on-chip device 4000, a plurality of electrical signals ES output from the ASIC 462 are input in parallel into the photonic spin register 400, an incident light Lb from the light source 464 is input into the photonic spin register 400, and a modulated light ML is output in series from the photonic spin register 400.

For example, in addition to the on-chip devices shown in FIGS. 6 and 13, the photonic spin registers of the above-described embodiments are available for various applications. For instance, an information-processing device or a magnetic memory which requires a photoelectric conversion or an electro-optic conversion may include such a photonic spin register.

Fifth Embodiment

Next, a fifth embodiment of the present invention will be described with reference to FIGS. 14 and 15. The fifth embodiment is directed to an information processing apparatus, and an information processing system including the photonic spin register.

Figure 14:
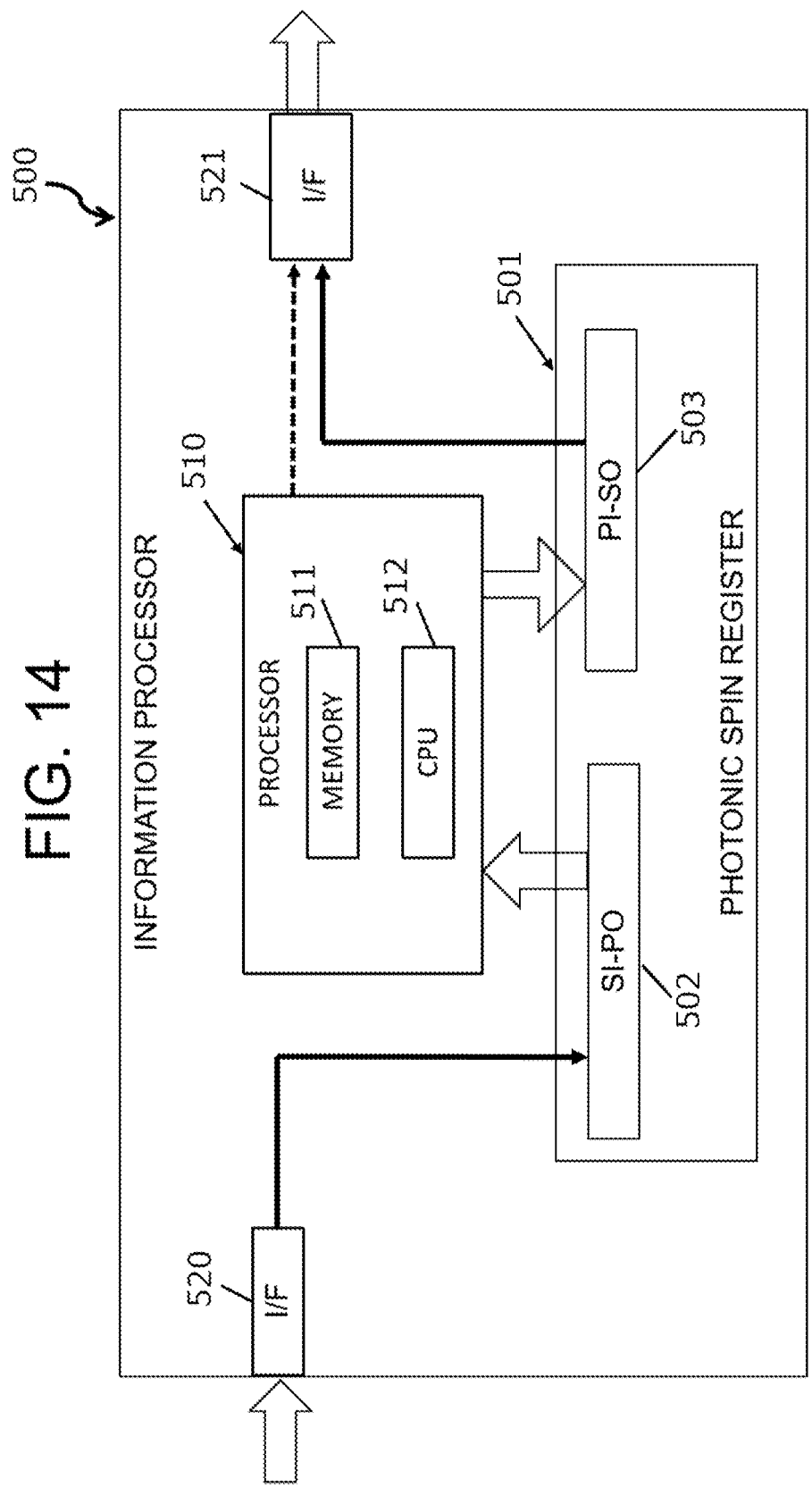
FIG. 14 is a functional block diagram illustrating one example of an information processing apparatus according to a fifth embodiment.

FIG. 14 is a functional block diagram showing an example of an information processing apparatus according to the fifth embodiment. The information processing apparatus 500 includes an input interface 520 that receives an optical signal from the outside, a unit 501 of the photonic spin register having a serial/parallel converter 502 (SI-IPO) that is a receiver and a parallel-serial converter 503 (PI-SO) that is a transmitter, a processing unit 510 having at least a memory 511 and a CPU 512, and an output interface 521 that transmits signals to the outside. A serial optical input signal from the outside passes through the input interface 520 and is converted into a parallel electric signal by the serial-to-parallel converter 502, converted into a desired signal (data) by the processing unit 510, processed by the parallel-serial converter 503 that converts into a serial optical signal, and the optical signal is output to the outside through the output interface 521. If required, a photoelectric conversion unit may be provided in the output interface 521 to output an electric signal, or a parallel-to-serial conversion unit may be provided in the output interface 521 so that the parallel electric signal is directly transferred from the processing unit 510 to the output interface 521 as a serial electric signal and a desired output electrical signal may be output. If desired, interfaces 520 and 521 may be terminals only.

Figure 15:
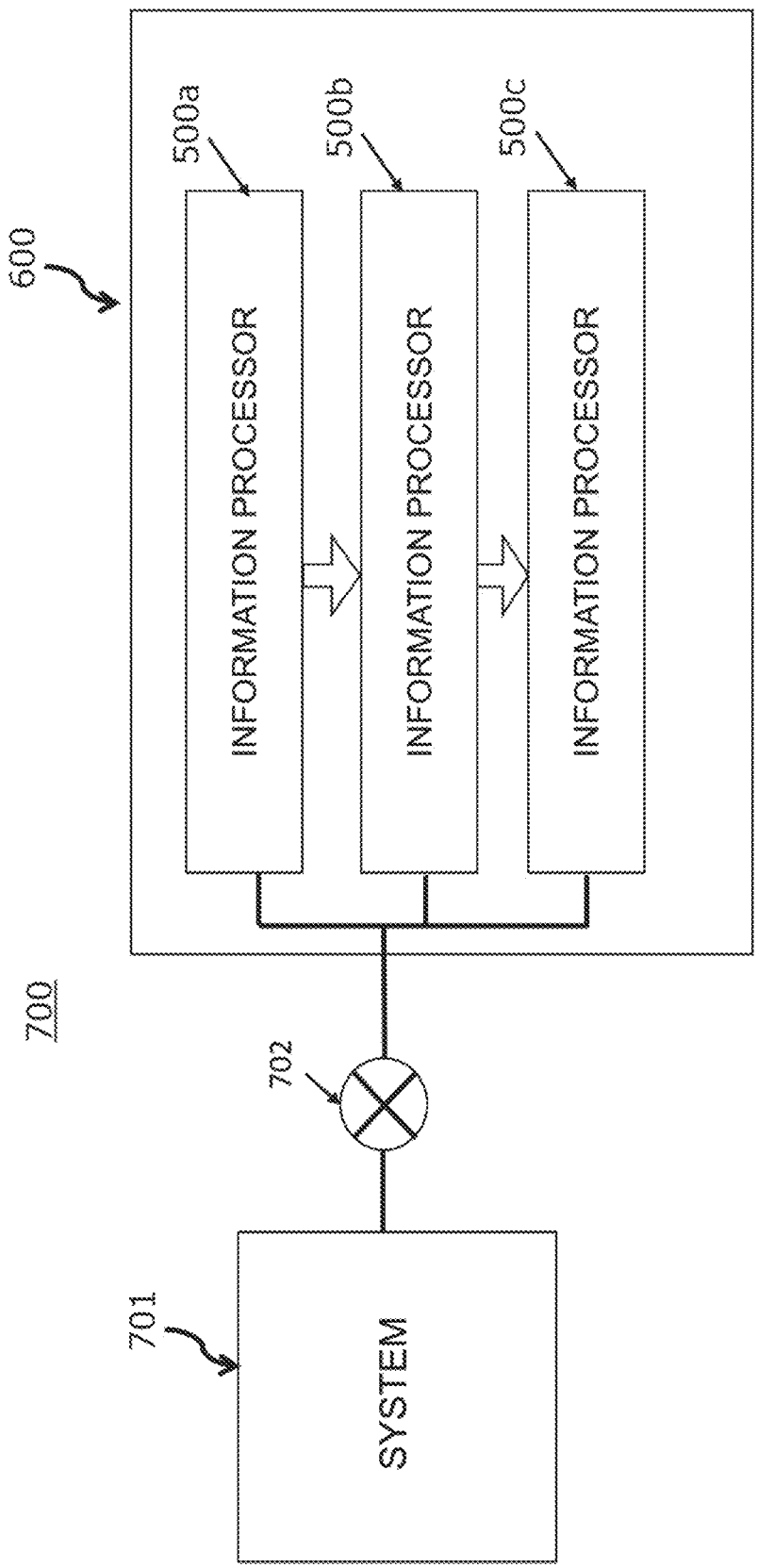
FIG. 15 is a functional block diagram illustrating one example of an information processing system having a plurality of information processing apparatuses of FIG. 14.

FIG. 15 is a functional block diagram showing an example of an information processing system having a plurality of information processing apparatuses of FIG. 14. The information processing system 700 includes an external system 701, a network 702, and a device 600 housing a plurality of information processing devices 500*a* to 500*c* having the same structure as in FIG. 14. Optical signals from the information processing device 500*a* that receives an optical signal from a device (not shown) inside the device 600 or from the network 702 are output to 500*b* and 500*c*, and the information processing results are output to the system 701 via the network 702 as optical signals or electrical signals. Further, the information processing apparatuses 500*a* to 500*c* may independently output their respective output signals directly to the system 701, or the signals from the system 701 may be input to the information processing apparatuses 500*a* to 500*c*, respectively. Although the number of information processing apparatuses 500*a* to 500*c* is three, the number is not limited as long as it is one or more. By using the desired system 701, the information processing system 700 may provide large-scale information system such as a data center or a server, enabling high-speed information processing.

In the above embodiments, when the shift current is always applied, a constant current or a pulse current that is the same as the transmission speed may be applied, or a configuration may be adopted in which the shift current is supplied or cut off at the timing of reading each shift register.

The invention is not limited to the above-described embodiments, and various modifications can be made without departing from the scope of the invention.

The invention claimed is:

1. A photonic spin register, comprising:
   a shift register unit including a magnetic material layer having a shape extending in one direction; and
   a write unit configured to write spin information into a magnetic domain in the magnetic material layer by transferring information included in an optical signal that is a pulse amplitude-modulated and serial input signal, to a spin state of the magnetic domain in the magnetic material layer by means of a photocurrent corresponding to the optical signal or by irradiation with the optical signal, wherein
   when a shift current flows through the shift register unit in the one direction, a domain wall is configured to move in the magnetic material layer, thereby allowing the spin information to move and be buffered in the magnetic material layer.

2. The photonic spin register according to claim 1, wherein
   the magnetic material layer is made of a topological antiferromagnet or a ferrimagnet.

3. The photonic spin register according to claim 1, wherein
   the shift register unit further includes a spin Hall layer through which the shift current is configured to flow to exhibit a spin Hall effect,
   the magnetic material layer is stacked on the spin Hall layer, and
   a spin-orbit torque from the spin Hall layer is configured to cause the domain wall to move in the magnetic material layer.

4. The photonic spin register according to claim 1, wherein
   the shift current flowing through the magnetic material layer is configured to induce a spin transfer torque that causes the domain wall to move in the magnetic material layer.

5. The photonic spin register according to claim 1, wherein
   the magnetic material layer includes: a first region in which a magnetic order direction is fixed in advance; and a second region in which information on a magnetic order is configured to be buffered as the spin information,
   the write unit is configured to write the spin information into the magnetic domain in the first region, and
   by moving the domain wall in the magnetic material layer by means of the shift current, the spin information is allowed to move from the first region to the second region.

6. The photonic spin register according to claim 5, further comprising a plurality of read elements arranged in the one direction on the second region in the magnetic material layer, wherein
   by writing and moving the spin information multiple times, a plurality of pieces of spin information are configured to be sequentially buffered in the second region, and
   the plurality of pieces of spin information are configured to be read out in parallel as a plurality of electrical signals via the plurality of read elements, respectively, by a magnetoresistance effect.

7. The photonic spin register according to claim 1, further comprising a photodetector configured to receive the optical signal and convert the optical signal into the photocurrent, wherein
   the write unit includes a spin Hall material configured to be electrically connected to the photodetector, stacked on a partial region on the magnetic material layer, and configured to exhibit a spin Hall effect by means of the photocurrent flowing through the spin Hall material from the photodetector, and
   when the photocurrent flows through the spin Hall material, a spin-orbit torque is induced to act on a magnetic order of the magnetic domain, thereby allowing reversal of the magnetic order.

8. The photonic spin register according to claim 7, wherein
   the photodetector includes a plasmon waveguide.

9. The photonic spin register according to claim 7, wherein
   the photodetector is configured to generate, as the photocurrent, an ultrashort pulsed current with a pulse width of 10 ps or less.

10. The photonic spin register according to claim 1, wherein
    the write unit includes a light irradiation unit configured to irradiate a partial region of the magnetic material layer directly with the optical signal, and
    the irradiation with the optical signal is configured to allow reversal of a magnetic order of the magnetic domain.

11. A photonic spin register, comprising:
    a photodetector configured to receive an optical signal that is a pulse amplitude-modulated and serial input signal and convert the optical signal into a photocurrent;
    a plurality of shift register units each including a magnetic material layer having a shape extending in one direction, the plurality of shift register units being arranged in parallel in a direction perpendicular to the one direction;

a write unit configured to be electrically connected to the photodetector and disposed on and intersecting the plurality of shift register units, wherein when the photocurrent flows through the write unit from the photodetector, the write unit is configured to write spin information into a magnetic domain in the magnetic material layer of each of the plurality of shift register units by transferring information included in the optical signal to a spin state of the magnetic domain in the magnetic material layer due to a spin Hall effect; and a control unit configured to be electrically connected to the plurality of shift register units and select one shift register unit through which a shift current is allowed to flow from among the plurality of shift register units, wherein when the shift current flows in the one direction through the one shift register unit selected by the control unit, a domain wall is configured to move in the magnetic material layer of the one shift register unit, thereby allowing the spin information to move and be buffered in the magnetic material layer.

12. The photonic spin register according to claim 11, further comprising a plurality of read elements arranged in the one direction on the magnetic material layer of each of the plurality of shift register units, wherein by writing and moving the spin information multiple times, a plurality of pieces of spin information are configured to be sequentially buffered in the magnetic material layer, and the plurality of pieces of spin information are configured to be read out in parallel as a plurality of electrical signals via the plurality of read elements, respectively, by a magnetoresistance effect.

13. The photonic spin register according to claim 12, wherein while the plurality of electrical signals are being read out in parallel from the one shift register unit via the plurality of read elements, respectively, the control unit is configured to cause the shift current to flow in the one direction through another shift register unit of the plurality of shift register units.

14. A photonic spin register, comprising:

a shift register unit including a magnetic material layer having a shape extending in one direction;

a plurality of spin Hall materials arranged in the one direction on the magnetic material layer and configured to exhibit spin Hall effects, wherein when a plurality of pulsed currents based on pieces of input information flow in parallel through the plurality of spin Hall materials, respectively, spin-orbit torques are induced to allow a plurality of pieces of spin information to be written into the magnetic material layer;

a read element disposed on the magnetic material layer so as to be adjacent to the plurality of spin Hall materials; and an optical modulator configured to be electrically connected to the read element, wherein when a shift current flows through the shift register unit in the one direction, domain walls are configured to move in the magnetic material layer, thereby allowing the plurality of pieces of spin information to move and be read out in series as an electrical signal via the read element by a magnetoresistance effect, and the optical modulator is configured to convert the electrical signal read out via the read element into an optical signal and output the optical signal.

15. A method of writing information, comprising:

writing spin information into a magnetic domain in a magnetic material layer having a shape extending in one direction by transferring information included in an optical signal that is a pulse amplitude-modulated and serial input signal, to a spin state of the magnetic domain in the magnetic material layer by means of a photocurrent corresponding to the optical signal or by irradiation with the optical signal.

16. The method according to claim 15, comprising:

using a photodetector to receive the optical signal and convert the optical signal into the photocurrent; and causing the photocurrent to flow through a spin Hall material disposed on the magnetic material layer to exhibit a spin Hall effect, the photocurrent inducing a spin-orbit torque to act on a magnetic order of the magnetic domain, thereby allowing reversal of the magnetic order.

17. The method according to claim 15, comprising:

using a light irradiation unit to irradiate the magnetic material layer directly with the optical signal, thereby allowing reversal of a magnetic order of the magnetic domain.

18. A method of reading out information, comprising:

writing spin information into a magnetic domain in a magnetic material layer having a shape extending in one direction by transferring information included in an optical signal that is a pulse amplitude-modulated and serial input signal, to a spin state of the magnetic domain in the magnetic material layer by means of a photocurrent corresponding to the optical signal or by irradiation with the optical signal;

moving the spin information written into the magnetic domain by moving a domain wall in the magnetic material layer by means of a shift current in the one direction;

writing and moving the spin information multiple times to sequentially buffer a plurality of pieces of spin information in the magnetic material layer; and reading out the plurality of pieces of spin information in parallel as a plurality of electrical signals via a plurality of read elements, respectively, by a magnetoresistance effect, the plurality of read elements being arranged in the one direction on the magnetic material layer.

19. A method of reading out information, comprising:

causing a plurality of pulsed currents based on pieces of input information to flow in parallel through a plurality of spin Hall materials, respectively, the plurality of spin Hall materials being arranged in one direction on a magnetic material layer having a shape extending in the one direction and configured to exhibit spin Hall effects, the plurality of pulsed currents inducing spin-orbit torques to allow a plurality of pieces of spin information to be written into the magnetic material layer in parallel;

moving the plurality of pieces of spin information by moving domain walls in the magnetic material layer by means of a shift current in the one direction;

reading out the plurality of pieces of spin information moving in the magnetic material layer, in series as an electrical signal by a magnetoresistance effect via a read element disposed on the magnetic material layer; and using an optical modulator to convert the electrical signal into an optical signal and output the optical signal.

20. An apparatus, comprising:
the photonic spin register according to claim 1; and
a unit connected to the photonic spin register inputting/outputting an optical signal from/to the photonic spin register.

21. An information processing system comprising at least one Information processing apparatus which is provided with the photonic spin register according to claim 1, an input interface receiving an optical signal from the outside, a unit providing at least serial-parallel conversion by the photonic spin register, and an external interface outputting a signal to the outside.

* * * * *